US010934616B2

(12) United States Patent
Tashiro et al.

(10) Patent No.: US 10,934,616 B2
(45) Date of Patent: Mar. 2, 2021

(54) CATHODE DEVICE AND SPUTTERING APPARATUS

(71) Applicant: ULVAC, Inc., Chigasaki (JP)

(72) Inventors: Yukihito Tashiro, Chigasaki (JP); Katsuaki Nakano, Chigasaki (JP)

(73) Assignee: ULVAC, Inc., Chigasaki (JP)

( * ) Notice: Subject to any disclaimer, the term of this patent is extended or adjusted under 35 U.S.C. 154(b) by 0 days.

(21) Appl. No.: 16/642,688

(22) PCT Filed: Oct. 3, 2019

(86) PCT No.: PCT/JP2019/039062
§ 371 (c)(1),
(2) Date: Feb. 27, 2020

(87) PCT Pub. No.: WO2020/085027
PCT Pub. Date: Apr. 30, 2020

(65) Prior Publication Data
US 2020/0377992 A1    Dec. 3, 2020

(30) Foreign Application Priority Data

Oct. 24, 2018  (JP) ............................. JP2018-199802

(51) Int. Cl.
*H01J 37/34* (2006.01)
*C23C 14/34* (2006.01)
*C23C 14/35* (2006.01)

(52) U.S. Cl.
CPC .......... *C23C 14/3407* (2013.01); *C23C 14/35* (2013.01); *H01J 37/345* (2013.01); *H01J 37/3417* (2013.01)

(58) Field of Classification Search
CPC ..... C23C 14/34; C23C 14/3407; C23C 14/35; H01J 37/34; H01J 37/3417; H01J 37/345; H01J 37/3452; H01J 37/3455
(Continued)

(56) References Cited

U.S. PATENT DOCUMENTS

2005/0274610 A1    12/2005    Iseki

FOREIGN PATENT DOCUMENTS

JP    H07166346    6/1995
JP    2001247956    9/2001
(Continued)

OTHER PUBLICATIONS

English abstract of JPH07166346.
(Continued)

*Primary Examiner* — Rodney G McDonald
(74) *Attorney, Agent, or Firm* — Caesar Rivise, PC

(57) ABSTRACT

A cathode device includes a rotation plate to which a magnetic circuit is fixed, a rotation mechanism including a rotation shaft that rotates the rotation plate when receiving power from a motor, and a linear motion parallel link mechanism. The parallel link mechanism includes an end effector, six links each having a distal end and a proximal end, and three linear motion mechanisms. The end effector rotationally supports the rotation shaft, the distal ends of the links are connected to the end effector, the links radially extend from the end effector, and the linear motion mechanisms move the proximal ends of adjacent two of the links in one direction when receiving power from respective linear actuators. A controller controls a change in position of the rotation shaft performed by a cooperative operation of the linear actuators, and controls rotation of the rotation shaft operated by the motor.

8 Claims, 9 Drawing Sheets

(58) Field of Classification Search
USPC .................................................. 204/298.2
See application file for complete search history.

(56) References Cited

FOREIGN PATENT DOCUMENTS

| | | |
|---|---|---|
| JP | 2005336520 | 12/2005 |
| JP | 2006002244 | 1/2006 |
| JP | 2010065300 | 3/2010 |
| JP | 2011214067 | 10/2011 |

OTHER PUBLICATIONS

English abstract of JP2001247956.
English abstract of JP2005336520.
English abstract of JP2006002244.
English abstract of JP2010065300.
English abstract of JP2011214067.
International Search Report of related PCT Application No. PCT/JP2019/039062 dated Nov. 5, 2019.
Written Opinion of related PCT Application No. PCT/JP2019/039062 dated Nov. 5, 2019.

CATHODE DEVICE AND SPUTTERING APPARATUS

CROSS-REFERENCE TO RELATED APPLICATIONS

This application is a U.S. National Phase Application under 35 U.S.C. 071 of PCT/JP2019/039062, filed Oct. 3, 2019 which claims priority to Japanese Patent Application No. 2018-199802, filed Oct. 24, 2018, the contents of which applications are incorporated by reference herein in their entireties.

TECHNICAL FIELD

The present invention relates to a cathode device including a magnetic circuit and a sputtering apparatus including the cathode device.

BACKGROUND OF THE INVENTION

A magnetic circuit included in a cathode device is disposed at a side of a target opposite to a film formation space and forms a leakage magnetic field in the film formation space. The leakage magnetic field includes a horizontal magnetic field extending along the surface of the target. The horizontal magnetic field increases the density of plasma in the vicinity of the surface of the target to improve the sputtering efficiency. The position where an erosion portion is formed is limited to a portion of the surface of the target at a position opposed to the horizontal magnetic field. Uneven formation of an erosion portion in the surface of the target, which indicates that a portion of the target is largely removed, causes the life of the target to shorten. In this regard, a technique that rotates the magnetic circuit is used in a sputtering apparatus including a magnetic circuit (for example, refer to Patent Documents 1, 2, and 3).

Patent Document 1: Japanese Laid-Open Patent Publication No. 7-166346

Patent Document 2: Japanese Laid-Open Patent Publication No. 2011-214067

Patent Document 3: Japanese Laid-Open Patent Publication No. 2001-247956

BRIEF SUMMARY OF THE INVENTION

However, in a technique that rotates the horizontal magnetic field, the horizontal magnetic field stays on portions of the surface of the target closer to the rotational center. Eventually, the erosion portion is unevenly formed in the surface of the target. In addition, when the strength of the horizontal magnetic field is constant throughout the period in which the horizontal magnetic field is rotated, the problem described above becomes more noticeable. There is a strong demand for a cathode device including a magnetic circuit that limits uneven formation of an erosion portion.

It is an object of the present invention to provide a cathode device and a sputtering apparatus that limit uneven formation of an erosion portion.

An embodiment of a cathode device includes a rotation plate to which a magnetic circuit is fixed, a rotation mechanism including a rotation shaft that rotates the rotation plate when receiving power from a motor, a linear motion parallel link mechanism, and a controller. The linear motion parallel link mechanism includes an end effector, six links each having a distal end and a proximal end, and three linear motion mechanisms. The end effector rotationally supports the rotation shaft. The distal ends of the links are connected to the end effector. The links radially extend from the end effector. The linear motion mechanisms move the proximal ends of adjacent two of the links in one direction when receiving power from respective linear actuators. The controller controls a change in position of the rotation shaft performed by a cooperative operation of the linear actuators, and controls rotation of the rotation shaft operated by the motor.

With the cathode device, the position of the rotation shaft, that is, the position of the magnetic circuit, is changeable at six degrees of freedom. This limits uneven formation of an erosion portion in the surface of a target. In addition, the rotation shaft, which is configured to rotate the magnetic circuit, changes the position of the magnetic circuit. This limits interference of rotation of the magnetic circuit with changes in the position of the magnetic circuit.

The cathode device described above may further include a tilt mechanism that inclines the linear motion parallel link mechanism together with the rotation plate from a target. In the cathode device, the linear motion parallel link mechanism is configured to be inclined from the target. This facilitates extension of a possible range of the orientation of the rotation shaft.

The cathode device described above may further include a tube having a tubular surface extending in the one direction. The linear motion mechanisms are supported by the tubular surface on the tube. In the cathode device, orientations of the linear motion mechanisms are maintained with the single tube. This limits occurrence of nonconformity in a cooperative operation of the linear motion mechanisms. As a result, the reproducibility of the cooperative operation of the linear actuators, ultimately, the reproducibility of the position of the magnetic circuit, is improved.

In the cathode device described above, the tube has opposite ends in the one direction and may include flanges extending radially outward from the opposite ends. In the cathode device, the flanges provided at opposite sides of the tube increase the rigidity of the tube. This further enhances the advantage of improving the reproducibility of the position of the magnetic circuit described above.

In the cathode device described above, each of the linear motion mechanisms may be disposed on an outer peripheral surface of the tube. The tube may include holes radially extending through the tube and extending in the one direction to allow the links to extend from an inside to an outside of the tube. In the cathode device, the linear motion mechanisms are disposed on the outer peripheral surface of the tube. This allows the inner space of the tube to be used other than for arrangement of the linear motion mechanisms.

In the cathode device described above, the tube may further include a hole radially extending through the tube to allow the rotation mechanism to extend from an inside to an outside of the tube. In the cathode device, the rotation mechanism is disposed so as to extend through the tube. This reduces limitations that would be imposed on the configuration of the rotation mechanism when the rotation mechanism is entirely accommodated in the tube.

In the cathode device described above, the controller may rotate the rotation shaft while changing the position of the rotation shaft. The cathode device shortens a period in which a horizontal magnetic field formed by the magnetic circuit continues to stay in a portion of the surface of the target. Thus, uneven formation of an erosion portion in the surface of the target is further limited.

An embodiment of a sputtering apparatus includes a vacuum chamber and a cathode device mounted on the vacuum chamber. The cathode device is the cathode device described above.

DETAILED DESCRIPTION OF THE INVENTION

First Embodiment

Figure 1:
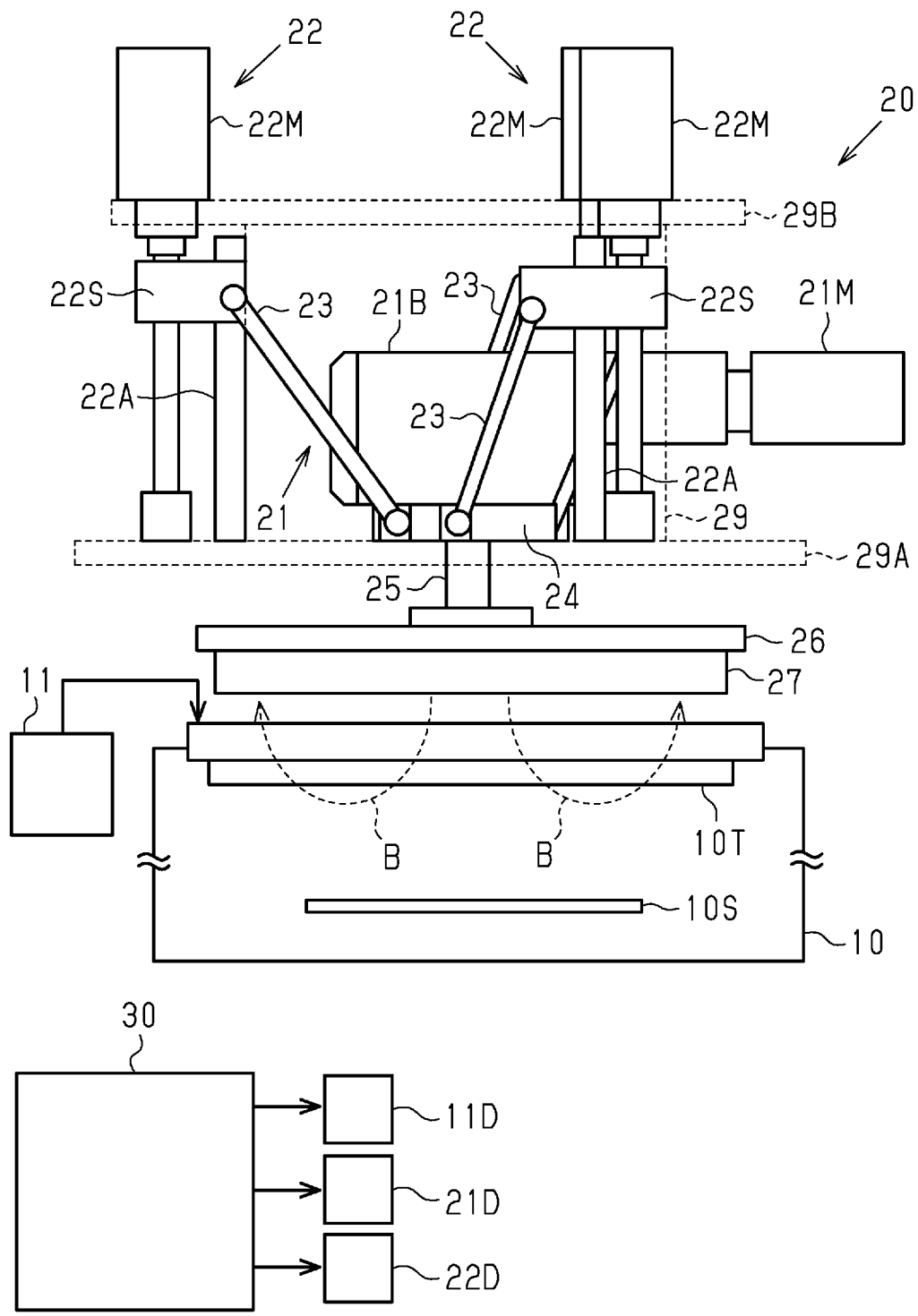
FIG. 1 is a schematic diagram showing the configurations of a sputtering apparatus according to a first embodiment.

A first embodiment of a cathode device and a sputtering apparatus will now be described with reference to FIGS. 1 to 8. FIG. 1 shows a cathode device including links, a rotation mechanism, and a tube and indicates the tube with broken lines so that the links and the rotation mechanism are shown.

As shown in FIG. 1, the sputtering apparatus includes a vacuum chamber 10 and a cathode device 20. The vacuum chamber 10 accommodates a target 10T. The vacuum chamber 10 accommodates a substrate 10S, which is a film formation subject, in a position opposed to the surface of the target 10T.

The cathode device 20 includes a rotation mechanism 21, a linear motion parallel link mechanism, a rotation plate 26, a tube 29, and a controller 30. The rotation mechanism 21, the linear motion parallel link mechanism, and the rotation plate 26 are disposed above the rear surface of the target 10T. The tube 29 includes a lower flange 29A and a top plate 29B forming a flange and is disposed above the rotation plate 26. The rotation mechanism 21 is accommodated in the tube 29.

The rotation plate 26 is a subject that is rotated by the rotation mechanism 21. The rotation plate 26 is disposed above the target 10T. A magnetic circuit 27 is disposed between the rotation plate 26 and the target 10T and is fixed to the rotation plate 26. The magnetic circuit 27 forms a leakage magnetic field B on the surface of the target 10T.

The rotation mechanism 21 includes a motor 21M, a transmission mechanism 21B, and a rotation shaft 25. The rotation shaft 25 couples an output shaft of the transmission mechanism 21B to the rotation plate 26. The transmission mechanism 21B transmits power from the motor 21M to the rotation shaft 25. When the power is transmitted through the transmission mechanism 21B, the motor 21M rotates the rotation plate 26 about the rotation shaft 25 so that the magnetic circuit 27 is rotated together with the rotation plate 26. When rotating, the magnetic circuit 27 rotates the leakage magnetic field B about the rotation shaft 25.

Linear Motion Parallel Link Mechanism

Figure 2:
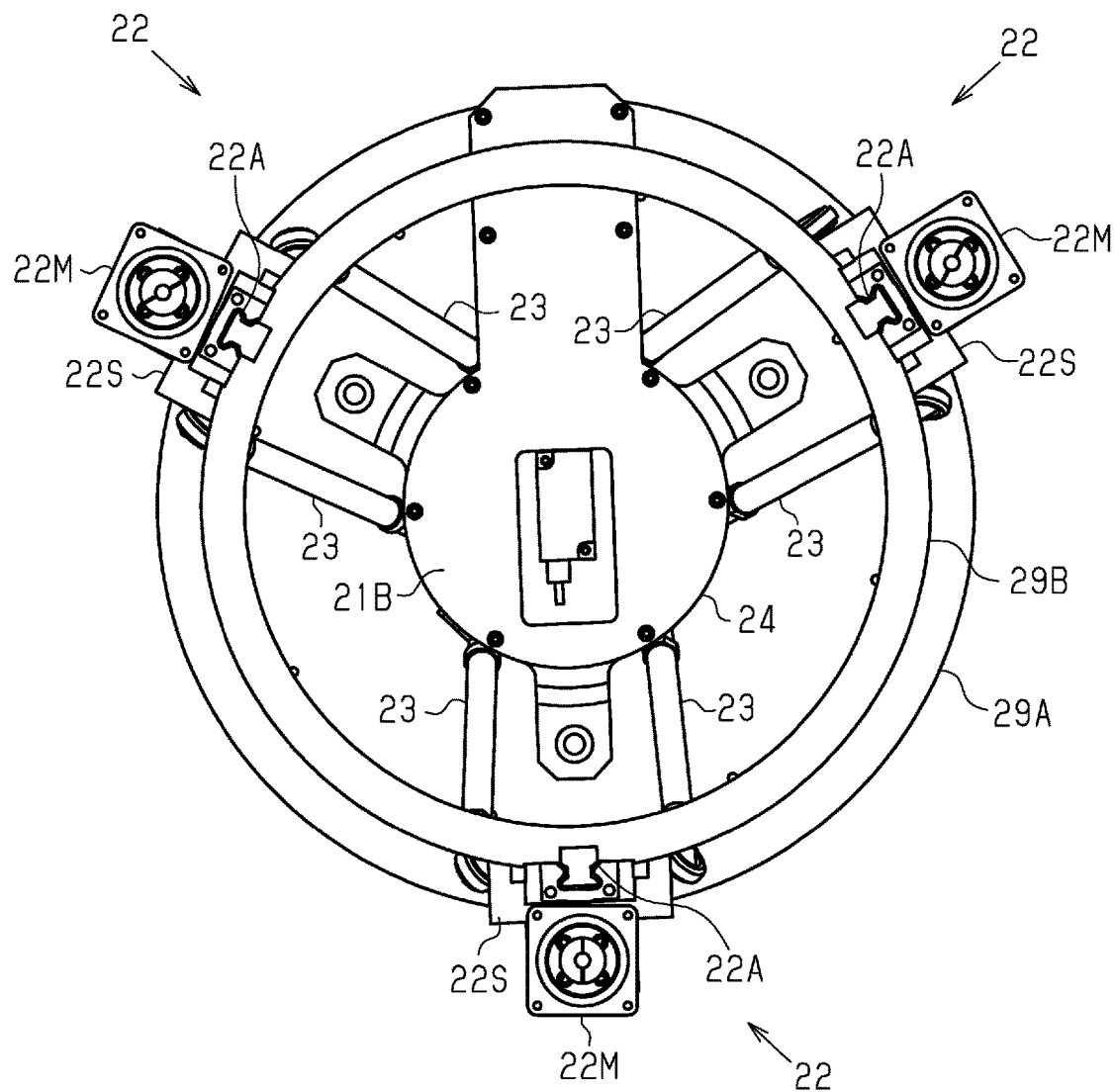
FIG. 2 is a plan view showing an arrangement of links in a cathode device of the first embodiment.
Figure 3:
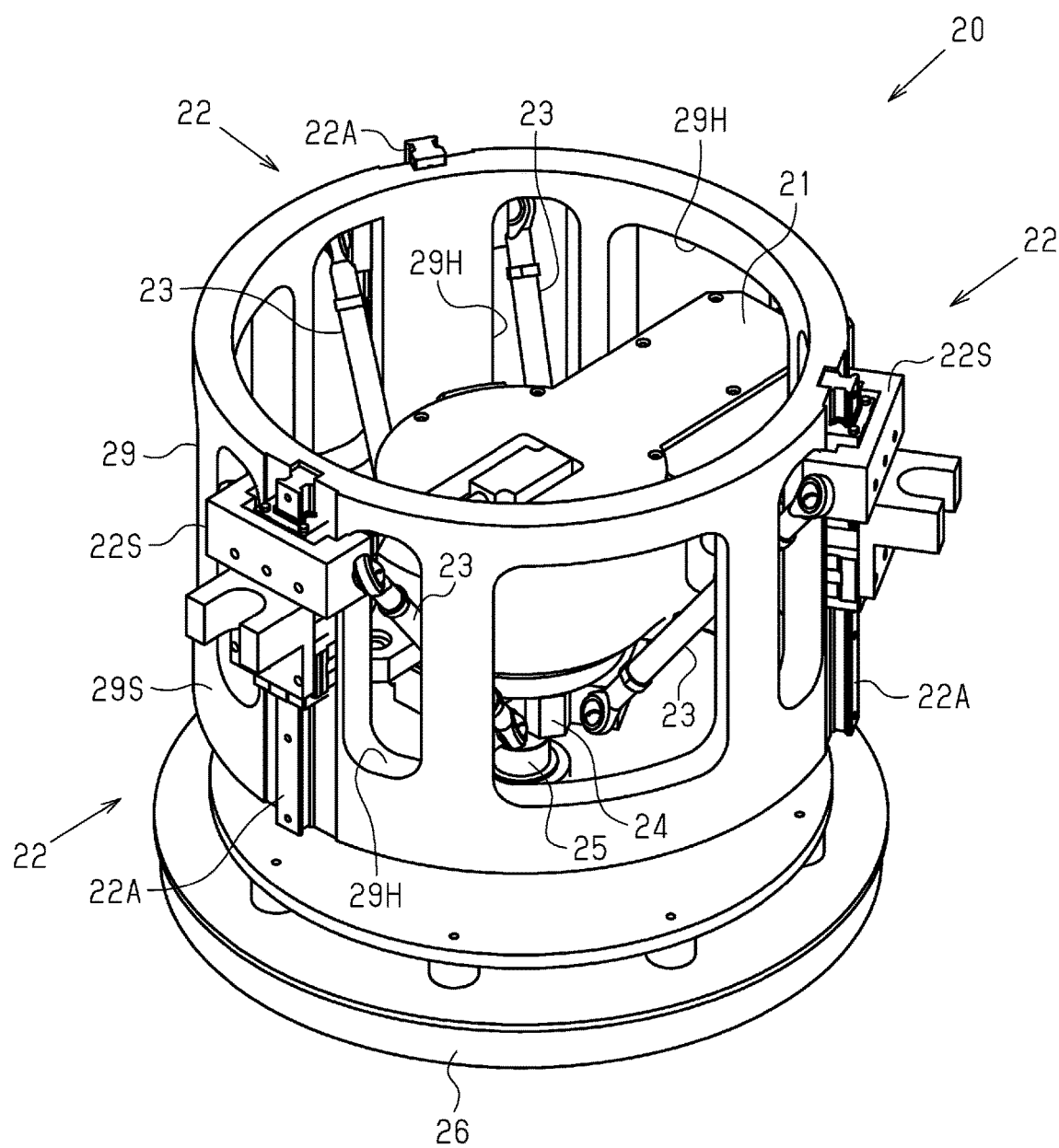
FIG. 3 is a perspective view showing an inner configuration of a tube of the cathode device of the first embodiment.

As shown in FIGS. 1 to 3, the linear motion parallel link mechanism includes three linear motion mechanisms 22, six links 23, and an end effector 24. The end effector 24 pivotally supports the rotation shaft 25 with a bearing. When the end effector 24 linearly moves in a vertical direction, the rotation shaft 25 linearly moves in the vertical direction together with the end effector 24. When the end effector 24 moves in a horizontal direction, the rotation shaft 25 moves in the horizontal direction together with the end effector 24. When the end effector 24 inclines, the rotation shaft 25 inclines together with the end effector 24. More specifically, in addition to rotating about the rotation center, the rotation shaft 25 interlocks with the end effector 24. The position of the rotation shaft 25 follows the position of the end effector 24. The position of the rotation shaft 25 includes the position of each portion of the rotation shaft 25. Changes in the position of the rotation shaft 25 include changes in orientation in which the position of each portion of the rotation shaft 25 is separately changed. In the same manner, the position of the end effector 24 includes the position of each portion of the end effector 24. Changes in the position of the end effector 24 include changes in orientation in which the position of each portion of the end effector 24 is separately changed.

Each of the links 23 has a distal end separately connected to the end effector 24 by a joint having a spherical surface. The links 23 radially extend from the end effector 24 (refer to FIG. 2). Each of the links 23 has a proximal end separately connected to one of the linear motion mechanisms 22 by a joint having a spherical surface. The six links 23 configure three link sets, each of which is configured by two of the links 23 that are adjacent to each other. The two links 23 configuring one of the link sets are connected to one of the linear motion mechanisms 22. The position of the end effector 24 changes in accordance with the driving of the linear motion mechanisms 22 at six degrees of freedom.

Each of the linear motion mechanisms 22 includes a linear actuator 22M, a linear guide 22A, and a slider 22S. The linear guide 22A extends in the vertical direction and restricts the direction in which the slider 22S moves to the vertical direction. The slider 22S is joined to the proximal ends of the two links 23 by the joints having a spherical surface. The linear motion mechanism 22 converts rotation of the linear actuator 22M into linear motion of the slider 22S in the vertical direction. The slider 22S receives power from the linear actuator 22M and moves the proximal end of each link 23 in the vertical direction. More specifically, each of the linear motion mechanisms 22 receives power from the linear actuator 22M and moves the proximal ends of the adjacent two links 23 (one link set) in one direction. In the present example, the one direction is the vertical direction. However, the one direction is defined as a direction that is orthogonal to the surface of the target 10T.

The controller 30 is not limited to a controller including a central processing unit (CPU) and various types of memories and configured to process all of the various processes through software. For example, the controller 30 may include hardware (application specific integrated circuit: ASIC) that executes at least some of the various processes. More specifically, the controller 30 may be configured to be circuitry that includes one or more dedicated hardware circuits such as an ASIC, one or more processors (microcomputers) operating in accordance with computer programs (software), or a combination of these.

The controller 30 separately transmits control signals to a power supply driver 11D, a motor driver 21D, and a linear motion driver 22D. The power supply driver 11D causes a power supply 11 to output power based on a control signal received from the controller 30. The motor driver 21D causes the motor 21M to be driven based on a control signal received from the controller 30. The linear motion driver 22D causes the linear actuators 22M to perform a cooperative operation based on a control signal received from the controller 30.

As shown in FIG. 3, the cathode device 20 includes the tube 29, which is a circular tube extending in the vertical direction. FIG. 3 does not show the lower flange 29A and the top plate 29B of the tube 29 so that through holes 29H extending through the tube 29 are illustrated.

The tube 29 includes an outer peripheral surface 29S, which is a circular tubular surface extending in the vertical direction. The three linear motion mechanisms 22 are disposed at equal intervals in a circumferential direction of the outer peripheral surface 29S. The three linear guides 22A are fixed to the outer peripheral surface 29S. When the linear guides 22A are joined to the outer peripheral surface 29S and movably support the three sliders 22S, the three sliders 22S are supported by the single tube 29.

The tube 29 includes multiple through holes 29H radially extending through the tube 29. One of the through holes 29H allows the rotation mechanism 21 to extend from the inside to the outside of the tube 29. Two of the through holes 29H that are adjacent to each other allow the two links 23 configuring one link set to extend from the inside to the outside of the tube 29. The through holes 29H having a size that allows the rotation mechanism 21 to extend through are disposed at equal intervals in a circumferential direction of the tube 29. The through holes 29H having a size that allows the two links 23 configuring one link set to extend through are also disposed at equal intervals in the circumferential direction of the tube 29. More specifically, the tube 29 is a structural body having a 120-degee rotational symmetry with respect to the axis of the tube 29.

Figure 4:
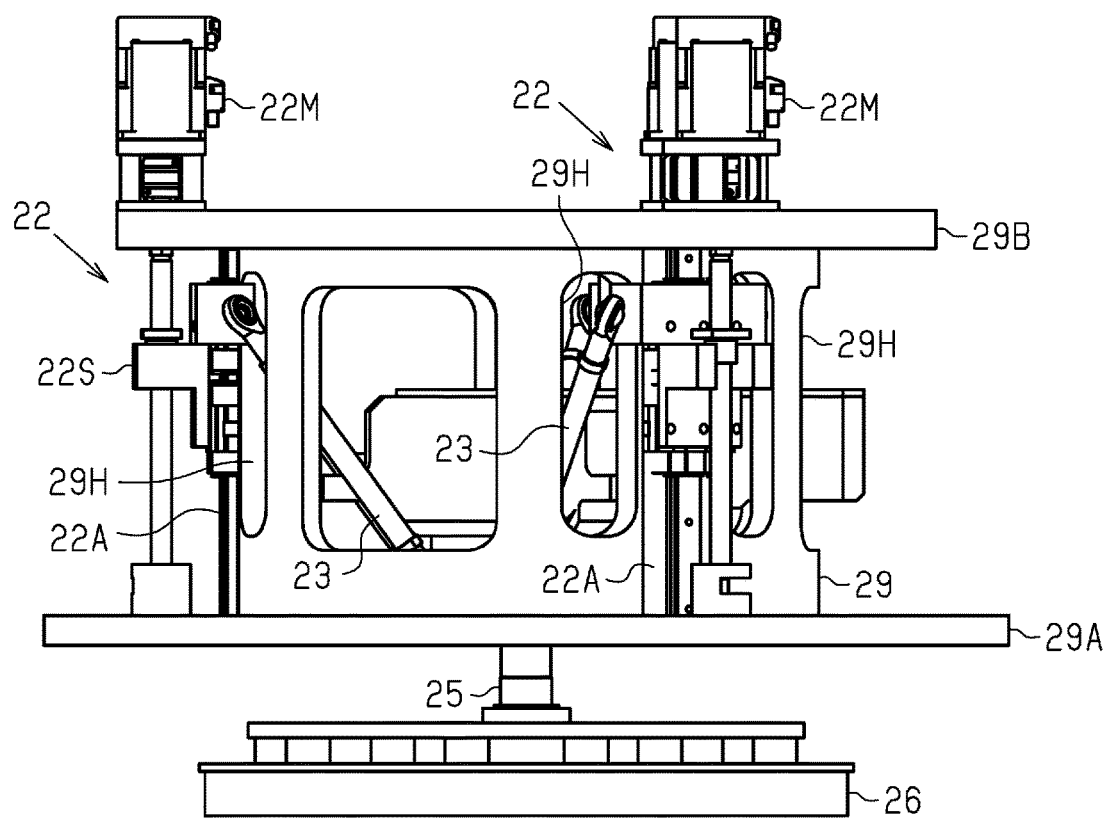
FIG. 4 is a side view of a structure showing an outer appearance of the tube of the cathode device of the first embodiment.

As shown in FIG. 4, the lower flange 29A and the top plate 29B are disposed at opposite ends in the extension direction of the tube 29 and extend outward in the radial direction of the tube 29. Although not shown in the drawings, the lower flange 29A is fixed to the vacuum chamber 10. The top plate 29B supports the linear actuators 22M. The lower flange 29A is an annular body that is concentric with the tube 29 and limits deformation of the tube 29, which includes the through holes 29H, from the circular tubular shape. The top plate 29B is discoid and concentric with the tube 29. The top plate 29B also limits deformation of the tube 29, which includes the through holes 29H, from the circular tubular shape.

Operation

The controller 30 retrieves a set position of the rotation shaft 25, a set path of the rotation shaft 25, and a set orientation of the rotation shaft 25 at each position as conditions for performing sputtering. The controller 30 outputs control signals for causing the linear actuators 22M to perform a cooperative operation based on the retrieved conditions so that the linear motion driver 22D causes the linear actuators 22M to perform the cooperative operation. In addition, the controller 30 outputs a control signal for causing the power supply 11 to output power for sputtering so that the power supply driver 11D drives the power supply 11. In addition, the controller 30 outputs a control signal for rotating the magnetic circuit 27 at a predetermined rotation speed so that the motor driver 21D drives the motor 21M. The sputtering apparatus moves the rotation shaft 25 in accordance with the retrieved conditions to perform sputtering on the target 10T while rotating the magnetic circuit 27.

Figure 5:
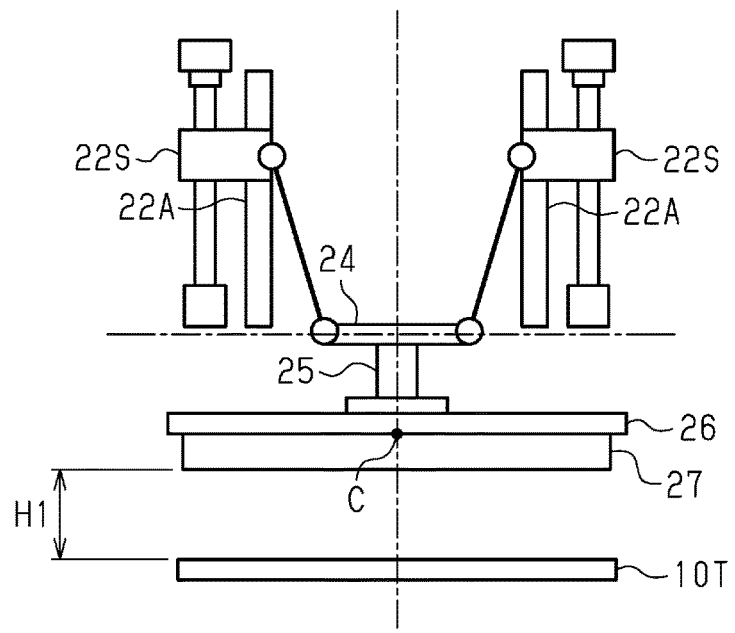
FIG. 5 is an operation diagram showing an operation performed by the cathode device of the first embodiment.

At this time, as shown in FIG. 5, the controller 30 retrieves, for example, a reference position as the set position of the rotation shaft 25. In the reference position, the rotation shaft 25 aligns a center C of the rotation plate 26 with the center of the target 10T in the same vertical line and sets a distance H1 between the magnetic circuit 27 and the target 10T to a predetermined reference value through the entire magnetic circuit 27. The controller 30 moves the sliders 22S so that the rotation shaft 25 is located in the reference position and rotates the rotation shaft 25 in the reference position.

Figure 6:
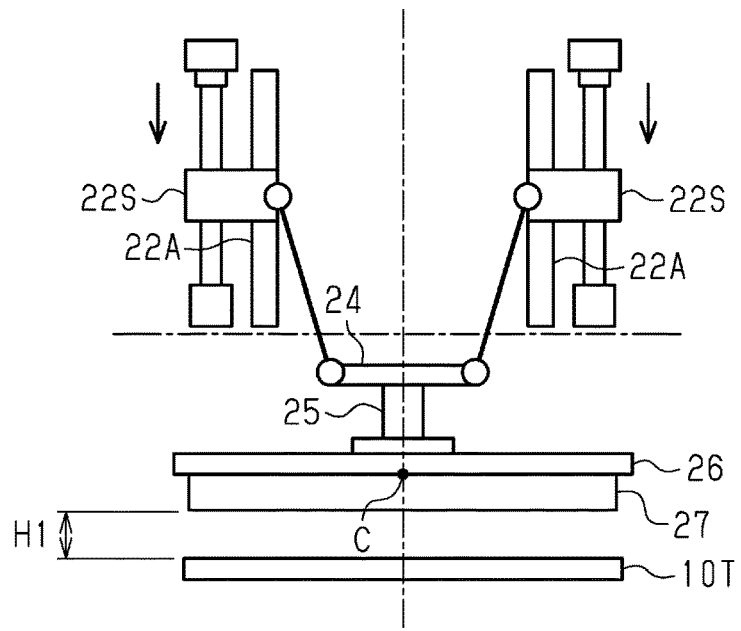
FIG. 6 is an operation diagram showing an operation performed by the cathode device of the first embodiment.

For example, as shown in FIG. 6, the controller 30 retrieves the reference position and a lower position as the set position of the rotation shaft 25 and also retrieves a path moving from the reference position to the lower position as the set path of the rotation shaft 25. In the lower position, the rotation shaft 25 sets the distance H1 between the magnetic circuit 27 and the target 10T to a value less than the reference value. The controller 30 lowers the sliders 22S through a cooperative operation so that the rotation shaft 25 moves from the reference position to the lower position. The controller 30 rotates the rotation shaft 25 while moving the rotation shaft 25 from the reference position to the lower position.

Figure 7:
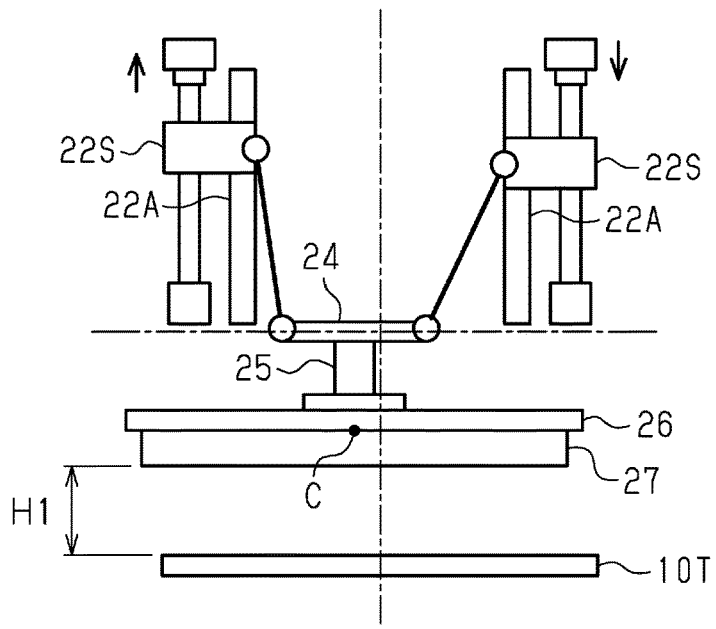
FIG. 7 is an operation diagram showing an operation performed by the cathode device of the first embodiment.

For example, as shown in FIG. 7, the controller 30 retrieves, for example, the reference position and an eccentric position as the set position of the rotation shaft 25 and also retrieves a path in which the rotation shaft 25 moves from the reference position to the eccentric position as the set path of the rotation shaft 25. In the eccentric position, the rotation shaft 25 separates the center C of the rotation plate 26 from the center of the target 10T and sets the distance H1 between the magnetic circuit 27 and the target 10T to the reference value. The controller 30 separately lowers or lifts the sliders 22S through a cooperative operation so that the rotation shaft 25 moves from the reference position to the eccentric position. The controller 30 rotates the rotation shaft 25 while moving the rotation shaft 25 from the reference position to the eccentric position.

Figure 8:
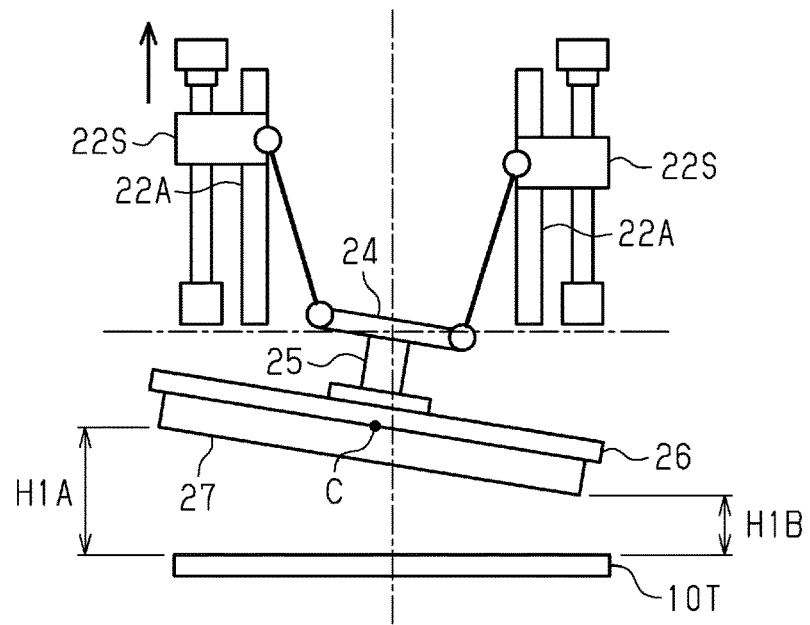
FIG. 8 is an operation diagram showing an operation performed by the cathode device of the first embodiment.

For example, as shown in FIG. 8, the controller 30 retrieves, for example, the reference position and an inclination position as the set position of the rotation shaft 25 and also retrieves a path in which the rotation shaft 25 moves from the reference position to the inclination position as the set path of the rotation shaft 25. In the inclination position, the rotation shaft 25 separates the center C of the rotation plate 26 from the center of the target 10T. In addition, in the inclination position, the rotation shaft 25 sets the distance between the magnetic circuit 27 and the target 10T to a distance H1A, which is greater than the reference value, at a point in the circumferential direction of the target 10T and to a distance H1B, which is less than the reference value, at another point in the circumferential direction of the target 10T. The controller 30 lifts one or two of the sliders 22S through a cooperative operation so that the rotation shaft 25 moves from the reference position to the inclination position. The controller 30 rotates the rotation shaft 25 while moving the rotation shaft 25 from the reference position to the inclination position.

The magnetic circuit 27 forms the leakage magnetic field B in two or more of the reference position, the lower position, an upper position, the eccentric position, and an inclined position. The magnetic circuit 27 in the lower position forms a horizontal magnetic field closer to the target 10T than the magnetic circuit 27 in the reference position. On the other hand, the magnetic circuit 27 in the upper position forms a horizontal magnetic field farther from the target 10T than the magnetic circuit 27 in the reference position. The magnetic circuit 27 in the inclined position changes the distance between the target 10T and the horizontal magnetic field in the surface of the target 10T. The magnetic circuit 27 moves the leakage magnetic field B along a path connecting two or more set positions.

The first embodiment has the advantages described below.

(1) The position of the rotation shaft 25, that is, the position of the magnetic circuit 27, is changeable at six degrees of freedom. This limits uneven formation of an erosion portion in the surface of the target 10T.

(2) The rotation shaft 25, which is configured to rotate the magnetic circuit 27, changes the position of the magnetic circuit 27. This limits interference of rotation of the magnetic circuit 27 with changes in the position of the magnetic circuit 27.

(3) When the sputtering apparatus performs sputtering, vibration produced by a vacuum pump and vibration produced by a robot conveying the substrate 10S are transmitted through the vacuum chamber 10 to the linear motion parallel link mechanism. In this case, since orientations of the linear guides 22A are maintained by the single tube 29, occurrence of unconformity of a cooperative operation of the linear motion mechanisms 22 is limited. As a result, this improves the reproducibility of the cooperative operation of the linear actuators 22M, and ultimately, the reproducibility of the position of the magnetic circuit 27.

(4) The tube 29 includes the through holes 29H, through which the rotation mechanism 21 and the links 23 extend. Hence, the rigidity of the tube 29 is decreased as compared to a structure that does not include the through holes 29H. In this regard, the lower flange 29A and the top plate 29B are provided at opposite sides of the tube 29 to increase the rigidity of the tube 29. Thus, even with the structure including the through holes 29H, an advantage similar to advantage (3) is obtained.

(5) The linear guides 22A are disposed on the outer peripheral surface 29S of the tube 29. This allows the inner space of the tube 29 to be used for, for example, arrangement of the rotation mechanism 21 in addition to arrangement of the linear motion mechanisms 22. In particular, a configuration in which the rotation shaft 25 of the rotation mechanism 21 interlocks with the end effector 24 increases the space occupied by the rotation mechanism 21. In this regard, with the configuration described above, the rotation mechanism 21 is readily disposed in the inner space of the tube 29. This reduces limitations imposed on the configuration of the rotation mechanism 21.

(6) The rotation mechanism 21 is disposed extending through one of the through holes 29H in the tube 29. This reduces limitations that would be imposed on the configuration of the rotation mechanism 21 when the rotation mechanism 21 is entirely accommodated in the inner space of the tube 29.

(7) The rotation shaft 25 rotates as the position and orientation of the rotation shaft 25 change. This shortens a period in which the horizontal magnetic field formed by the magnetic circuit 27 continues to stay in a portion of the surface of the target 10T. Thus, uneven formation of an erosion portion in the surface of the target 10T is further limited.

(8) The position of the magnetic circuit 27 is changed by changing the position and orientation of the rotation shaft 25. This allows the position of the magnetic circuit 27 to be readily changed while rotating the magnetic circuit 27. In addition, the operations of the magnetic circuit 27 are readily synchronized so that, for example, the magnetic circuit 27 rotates at different speeds in different positions of the magnetic circuit 27 and so that the magnetic circuit 27 rotates at different speeds with different orientations of the magnetic circuit 27.

Second Embodiment

A second embodiment of a cathode device and a sputtering apparatus will now be described with reference to FIG. 9. The second embodiment differs from the first embodiment mainly in the structure of the rotation mechanism 21. The description will focus on the differences from the first embodiment with reference to FIG. 9, which corresponds to FIG. 1 used in the description of the first embodiment.

Figure 9:
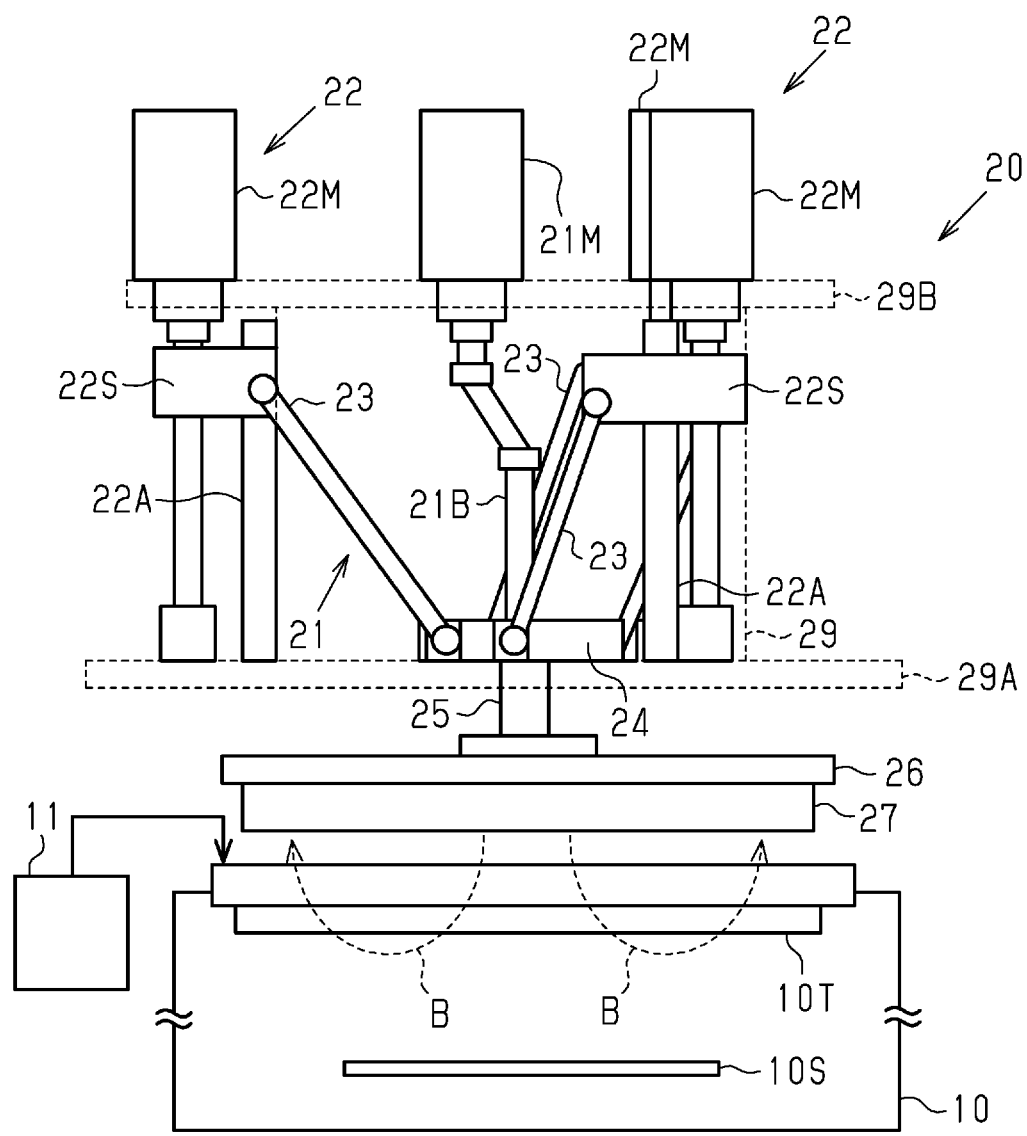
FIG. 9 is a schematic diagram showing the configurations of a sputtering apparatus according to a second embodiment.

As shown in FIG. 9, the motor 21M of the rotation mechanism 21 is mounted on the top plate 29B. The output shaft of the motor 21M extends downward from the top plate 29B and is coupled to the rotation plate 26 by the transmission mechanism 21B. The transmission mechanism 21B is a universal joint having a spline shaft and transmits rotational power output from the motor 21M to the rotation shaft 25 regardless of the position of the rotation shaft 25. When the power is transmitted through the transmission mechanism 21B, the motor 21M rotates the rotation plate 26 about the rotation shaft 25 so that the magnetic circuit 27 is rotated together with the rotation plate 26.

The second embodiment has the advantages described below.

(9) The universal joint having a spline shaft extends to follow in a direction in which the output shaft of the motor 21M extends. The transmission mechanism 21B eases a load state in which a load is applied in a direction orthogonal to the shaft. As a result, the mechanism that rotates the rotation shaft 25 smoothly operates.

Third Embodiment

A third embodiment of a cathode device and a sputtering apparatus will now be described with reference to FIGS. 10 and 11. The third embodiment differs from the second embodiment mainly in that the cathode device includes a tilt mechanism. The description will focus on the differences from the second embodiment with reference to FIG. 10, which corresponds to FIG. 9 used in the description of the second embodiment, and FIG. 11, which corresponds to FIG. 7 used in the description of the first embodiment.

Figure 10:
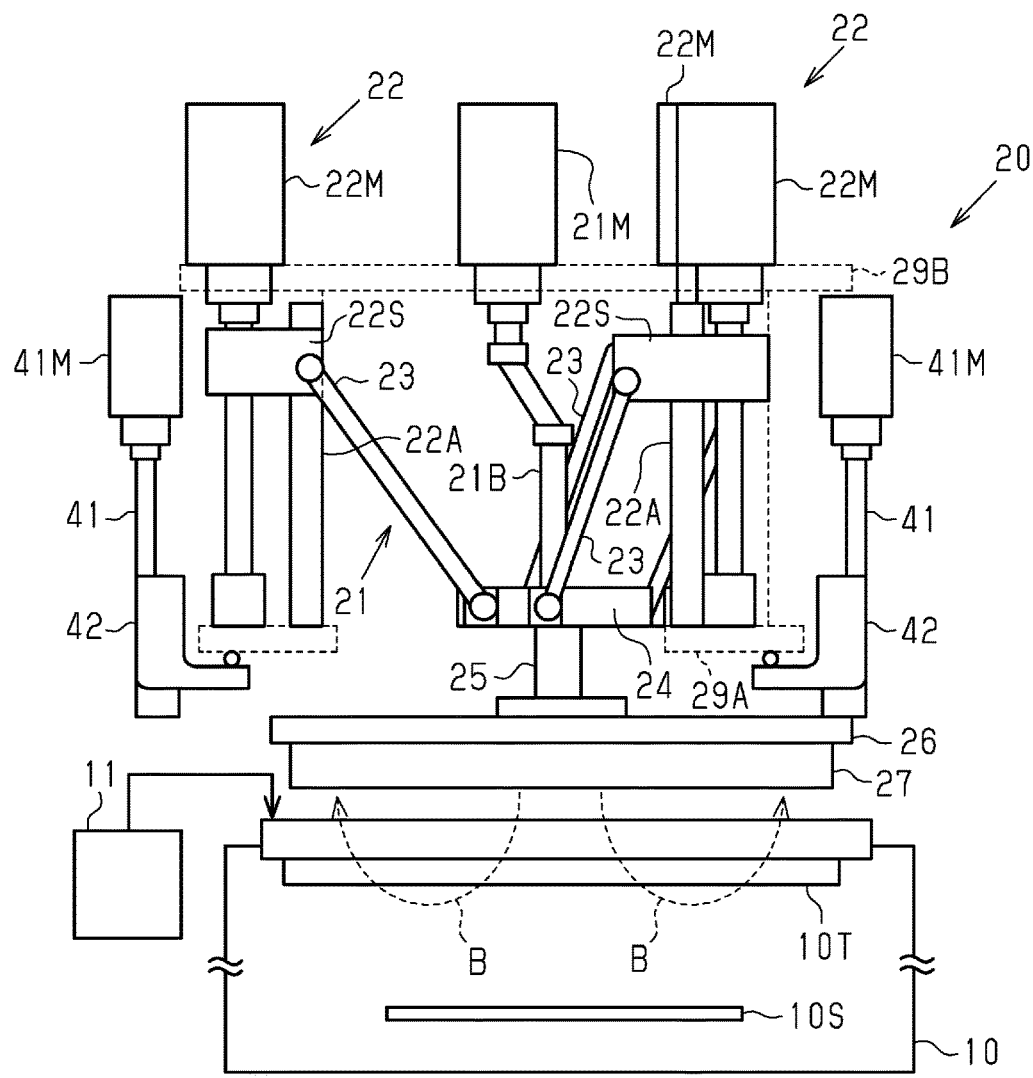
FIG. 10 is a schematic diagram showing the configurations of a sputtering apparatus according to a third embodiment.

As shown in FIG. 10, the cathode device 20 includes a tilt mechanism that includes three linear actuators 41M, three linear guides 41, and three sliders 42. FIGS. 10 and 11 show only two of the linear actuators 41M, two of the linear guides 41, and two of the sliders 42. The sliders 42 are disposed around the lower flange 29A at equal intervals. Each of the sliders 42 supports the lower flange 29A from a lower side with a joint having a spherical surface. The linear guides 41 are disposed around the tube 29 at equal intervals at an outer side of the tube 29. The linear guides 41 restrict movement of the respective sliders 42 to the vertical direction. The linear actuators 41M move the respective sliders 42 in the vertical direction.

The controller 30 transmits a control signal to a tilt driver 41D. The tilt driver 41D drives each of the linear actuators 41M based on the control signal received from the controller 30. The tilt driver 41D causes the linear actuators 41M to perform a cooperative operation based on a control signal received from the controller 30. The controller 30 inclines the entirety of the linear motion parallel link mechanism from the target 10T together with the rotation shaft 25 and the rotation plate 26.

Figure 11:
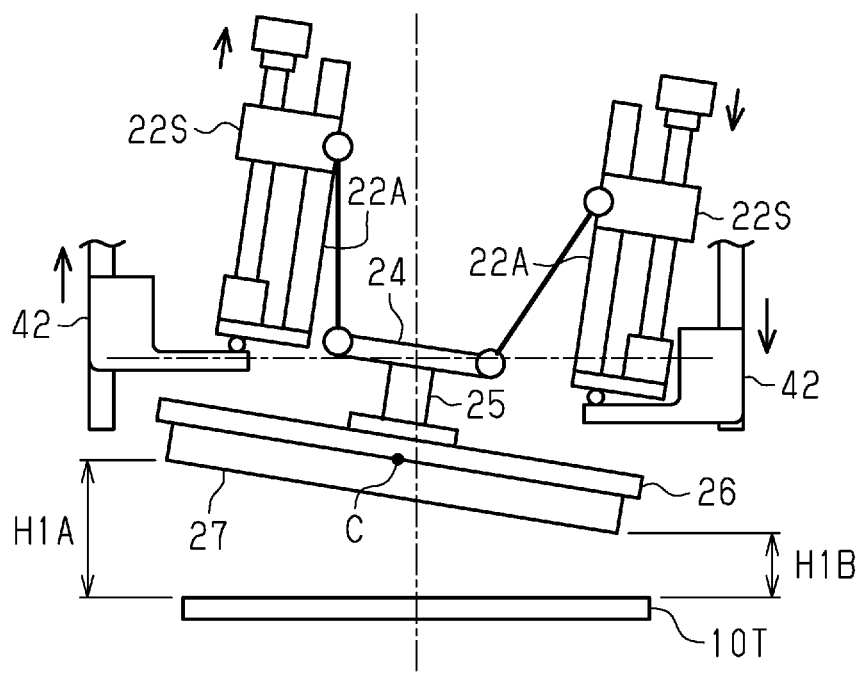
FIG. 11 is an operation diagram showing an operation performed by the cathode device of the third embodiment.

In addition, for example, as shown in FIG. 11, the controller 30 retrieves, for example, a path in which the rotation shaft 25 moves from the reference position to the eccentric position as the set path of the rotation shaft 25. The controller 30 separately lowers or lifts the sliders 22S through a cooperative operation so that the rotation shaft 25 moves from the reference position to the eccentric position. The controller 30 moves the rotation shaft 25 from the reference position to the eccentric position. The controller 30 also retrieves the inclination position as the set position of the rotation shaft 25. In the inclination position, the rotation shaft 25 sets the distance between the magnetic circuit 27 and the target 10T to the distance H1A, which is greater than the reference value, at a point in the circumferential direction of the target 10T and to the distance H1B, which is less than the reference value, at another point in the circumferential direction of the target 10T. The controller 30 moves the sliders 42 so that the rotation shaft 25 moves to the inclination position. The controller 30 rotates the rotation shaft 25 while moving the rotation shaft 25 to the inclination position.

The third embodiment has the advantages described below.

(10) The linear motion parallel link mechanism is configured to be inclined from the target 10T. This facilitates extension of a possible range of the orientation of the rotation shaft 25.

The embodiments described above may be modified as follows.

Drive Modes

When sputtering is performed, the controller 30 may change only the position of the rotation shaft 25 with rotation of the rotation shaft 25 stopped. Alternatively, when sputtering is performed, the controller 30 may change only the orientation of the rotation shaft 25 with rotation of the rotation shaft 25 stopped. That is, the controller 30 may stop rotation of the rotation shaft 25 and move the rotation shaft 25 along the set path.

The controller 30 may change the position of the rotation shaft 25 to the next set position with rotation of the rotation shaft 25 stopped, and start to rotate the rotation shaft 25 when the rotation shaft 25 reaches the next set position. That is, the controller 30 may stop rotation of the rotation shaft 25 during movement from the present set position to the next set position, and rotate the rotation shaft 25 at each of the set positions.

The controller 30 may change the position of the rotation shaft 25 between inclined positions differing from each other. For example, the controller 30 may allow the rotation shaft 25 to undergo precession.

Tube

The tube 29 is not limited to a circular tube. Accordingly, the outer peripheral surface 29S (tubular surface) of the tube 29 is not limited to a circular tubular surface.

The rotation mechanism 21 may be accommodated in the inner space of the tube 29. In addition, the linear guides 22A, the sliders 22S, and the links 23 may be accommodated in the inner space of the tube 29. In the configurations described above, the through holes 29H may be omitted from the tube 29. This improves the reproducibility similarly to advantage (3) described above. In this case, the linear guides 22A may be fixed to the inner peripheral surface of the tube 29.

The linear guides 22A may be fixed to the top surface of the vacuum chamber 10. In this configuration, the tube 29 may be omitted. This reduces the number of components configuring the cathode device.

The tilt mechanism of the third embodiment may be used in the cathode device of the first embodiment.

LIST OF REFERENCE CHARACTERS

B) leakage magnetic field, 10) vacuum chamber, 10T) target, 10S) substrate, 11D) power supply driver, 21D) motor driver, 22D) linear motion driver, 20) cathode device, 21) rotation mechanism, 21M) motor, 21B) transmission mechanism, 22) linear motion mechanism, 22A) linear guide, 22M) linear actuator, 22S) slider, 23) link, 24) end effect, 25) rotation shaft, 26) rotation plate, 27) magnetic circuit, 29) tube, 29H) through hole, 29A) lower flange, 29B) top plate, 29S) outer peripheral surface, 30) controller.

The invention claimed is:

1. A cathode device, comprising:
   a rotation plate to which a magnetic circuit is fixed;
   a rotation mechanism including a rotation shaft that rotates the rotation plate when receiving power from a motor;
   a linear motion parallel link mechanism including an end effector, six links each having a distal end and a proximal end, and three linear motion mechanisms, wherein the end effector rotationally supports the rotation shaft, the distal ends of the links are connected to the end effector, the links radially extend from the end effector, and the linear motion mechanisms move the proximal ends of adjacent two of the links in one direction when receiving power from respective linear actuators; and
   a controller that controls a change in position of the rotation shaft performed by a cooperative operation of the linear actuators, and controls rotation of the rotation shaft operated by the motor.

2. The cathode device according to claim 1, further comprising:
   a tilt mechanism that inclines the linear motion parallel link mechanism together with the rotation plate from a target.

3. The cathode device according to claim 1, further comprising:
   a single tube having a tubular surface extending in the one direction,
   wherein the linear motion mechanisms are supported by the tubular surface on the tube.

4. The cathode device according to claim 3, wherein the tube has opposite ends in the one direction and includes flanges extending radially outward from the opposite ends.

5. The cathode device according to claim 3 or 1, wherein each of the linear motion mechanisms is disposed on an outer peripheral surface of the tube,
   the tube includes holes radially extending through the tube and extending in the one direction, and the holes allow the links to extend from an inside to an outside of the tube.

6. The cathode device according to claim 3, wherein the tube further includes a hole radially extending through the tube to allow the rotation mechanism to extend from an inside to an outside of the tube.

7. The cathode device according to claim 1, wherein the controller rotates the rotation shaft while changing the position of the rotation shaft.

8. A sputtering apparatus, comprising:
   a vacuum chamber; and
   a cathode device mounted on the vacuum chamber, wherein the cathode device is the cathode device according to claim 1.

* * * * *